United States Patent
Schneider et al.

(10) Patent No.: US 6,263,829 B1
(45) Date of Patent: *Jul. 24, 2001

(54) PROCESS CHAMBER HAVING IMPROVED GAS DISTRIBUTOR AND METHOD OF MANUFACTURE

(75) Inventors: Gerhard Schneider, Cupertino; Edwin C. Weldon, Los Gatos, both of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/235,861

(22) Filed: Jan. 22, 1999

(51) Int. Cl.[7] ..................................................... C23C 16/44
(52) U.S. Cl. ...................................... 118/723 I; 118/723 I; 118/723 ER; 118/723 E; 118/723 R; 118/723 ME; 118/723 MP; 156/345; 204/298.33
(58) Field of Search ............................... 118/723 I, 723 E, 118/723 ER, 723 R, 723 ME, 723 MP; 156/345; 204/298.33

(56) References Cited

U.S. PATENT DOCUMENTS

| 4,384,918 | 5/1983 | Abe ........................................... 216/71 |
| 4,412,133 | 10/1983 | Eckes et al. ......................... 250/492.2 |
| 4,480,284 | 10/1984 | Tojo et al. ............................ 361/234 |

(List continued on next page.)

FOREIGN PATENT DOCUMENTS

| 0410442 | 7/1990 | (EP) . |
| 0439000 | 1/1991 | (EP) . |
| 0601788 | 12/1993 | (EP) . |
| 0635869 | 4/1994 | (EP) . |
| 0709875 | 10/1995 | (EP) . |
| 0791956 | 9/1996 | (EP) . |
| 0880164 | 5/1998 | (EP) . |
| 2-27748 | 1/1990 | (JP) . |
| 4-367247 | 12/1992 | (JP) . |
| 06232243 | 8/1994 | (JP) . |
| 09017850 | 1/1997 | (JP) . |
| WO 9800576 | 1/1998 | (WO) . |

OTHER PUBLICATIONS

PCT Search Report dated Sep. 10, 1999.
PCT Search Report dated Oct. 20, 1999.
Daviet, et al., "Electrostatic Clamping Applied to Semiconductor Plasma Processing—I. Theoretical Modeling," *J. Electrochem. Soc.*, 140(11):3245–3255 (Nov. 1993).
Daviet, et al., "Electrostatic Clamping Applied to Semiconductor Plasma Processing—II. Experimental Results," *J. Electrochem. Soc.*, 140(11):3256–3261 (Nov. 1993).
Nakasuji, et al., "Low Voltage and High Speed Operating Electrostatic Wafer Chuck," *J. Vac. Sci. Technol. A.*, 10(6):3573–3578 (Nov./Dec. 1992).

(List continued on next page.)

*Primary Examiner*—Gregory Mills
*Assistant Examiner*—Rudy Zervigon
(74) *Attorney, Agent, or Firm*—Ashok Janah; Janah and Associates

(57) ABSTRACT

A process chamber 15 for processing a substrate 30, such as a semiconductor wafer, comprises a support 20 having a surface 25 for supporting the substrate 30. A gas distributor 50 in the chamber comprises a gas manifold 110 comprising at least one insert 140 having an orifice 115 for passing gas from the gas manifold 110 into the process chamber 15. Preferably, the gas manifold 110 extends about a perimeter 130 of the substrate 30 and comprises a plurality of inserts 140 made from dielectric material.

55 Claims, 7 Drawing Sheets

U.S. PATENT DOCUMENTS

| | | | |
|---|---|---|---|
| 4,645,218 | | 2/1987 | Ooshio et al. .................... 156/345 |
| 4,665,463 | | 5/1987 | Ward et al. .................... 313/231.31 |
| 4,832,781 | | 5/1989 | Mears .................... 361/234 |
| 4,935,661 | | 6/1990 | Heinecke et al. .................... 501/127 |
| 5,055,964 | | 10/1991 | Logan et al .................... 307/130 |
| 5,104,834 | | 4/1992 | Watanabe et al. .................... 501/127 |
| 5,117,121 | | 5/1992 | Watanabe et al. .................... 307/230 |
| 5,151,845 | | 9/1992 | Watanabe et al. .................... 361/234 |
| 5,166,856 | | 11/1992 | Liporace et al. .................... 361/233 |
| 5,191,506 | | 3/1993 | Logan et al. .................... 361/234 |
| 5,258,047 | | 11/1993 | Tokisue et al. .................... 29/25.01 |
| 5,269,847 | | 12/1993 | Anderson et al. .................... 118/715 |
| 5,270,266 | | 12/1993 | Hirano et al. .................... 156/345 |
| 5,275,683 | | 1/1994 | Arami et al. .................... 438/715 |
| 5,280,156 | | 1/1994 | Niori et al. .................... 219/385 |
| 5,315,473 | | 5/1994 | Collins et al. .................... 361/234 |
| 5,324,053 | | 6/1994 | Kubota et al. .................... 361/234 |
| 5,324,411 | | 6/1994 | Ichishima et al. .................... 279/128 |
| 5,325,261 | | 6/1994 | Horowitz .................... 204/298.33 |
| 5,350,479 | | 9/1994 | Collins et al. .................... 156/345 |
| 5,376,213 | | 12/1994 | Ueda et al. .................... 156/345 |
| 5,382,469 | | 1/1995 | Kubota et al. .................... 428/332 |
| 5,455,070 | | 10/1995 | Anderson et al. .................... 427/248.1 |
| 5,463,526 | | 10/1995 | Mundt .................... 361/234 |
| 5,522,934 | | 6/1996 | Suzuki et al. .................... 216/67 |
| 5,542,559 | | 8/1996 | Kawakami et al. .......... 118/723 AN |
| 5,556,521 | | 9/1996 | Ghanbari .................... 204/192.32 |
| 5,653,808 | | 8/1997 | MacLeish .................... 118/715 |
| 5,683,517 | | 11/1997 | Shan .................... 118/723 E |
| 5,710,407 | | 1/1998 | Moore et al. .................... 219/405 |
| 5,720,818 | | 2/1998 | Donde et al. .................... 118/500 |
| 5,767,628 | | 6/1998 | Keller et al. .................... 315/111.51 |
| 5,870,271 | * | 2/1999 | Herchen .................... 361/234 |
| 5,882,417 | * | 3/1999 | Van De Ven et al. .................... 118/728 |
| 5,886,863 | | 3/1999 | Nagasaki et al. .................... 361/234 |
| 5,936,829 | * | 10/1999 | Moslehi .................... 361/234 |
| 5,948,168 | * | 9/1999 | Shan et al. .................... 118/723 R |
| 6,001,267 | * | 2/1999 | Os et al. .................... 216/67 |
| 6,108,189 | | 8/2000 | Weldon et al. .................... 361/234 |

OTHER PUBLICATIONS

Tucker, Jr., Robert C., "Plasma and Detonation Gun Deposition Techniques and Coating Properties," Union Carbide Corporation, Coatings Service Department, Indianapolis, Indiana; pp. 454–489.

Watanabe, et al., "Effect of Additives on the Electrostatic Force of Alumina Electrostatic Chucks," *J. of the Ceramic Soc. of Jpn,* 100(1):1–6 (1992).

Watanabe, et al., "Electrostatic Force and Absorption Current of Alumina Electrostatic Chuck," *Jpn. J. Appl. Phys.,* 31(Pt. 1, No. 7):2145–2150 (1992).

Watanabe, et al., "Relationship between Electrical Resistivity and Electrostatic Force of Alumina Electrostatic Chuck," *Jpn. J. Appl. Phys.,* 32(Pt. 1, No. 2):864–871 (1993).

Watanabe, et al., "Resistivity and Microstructure of Alumina Ceramics Added with $TiO_2$ Fired in Reducing Atmosphere," *J. of the Ceramic Soc. of Jpn Int. Ed.,* 101:1076–1083.

Wright et al., "Low Temperature Etch Chuck: Modeling and Experimental Results of Heat Transfer and Wafer Temperature," *J. Vac. Sci. Technol. A,* 10(4):1065–1070 (Jul./Aug. 1992).

U.S. Application Ser. No. 08/372,177, filed Jan. 12, 1995, Pat. No. 5,792,562.

U.S. Application Ser. No. 08/475,368, filed Jun. 7, 1995, Pat. No. 5,684,669.

U.S. Patent Application entitled, "Semiconductor Process Chamber Having Improved Gas Distrubutor"; filed May 28, 1998; Ser. No. 09/086,704; Inventors: Kholodenko, et al.

* cited by examiner

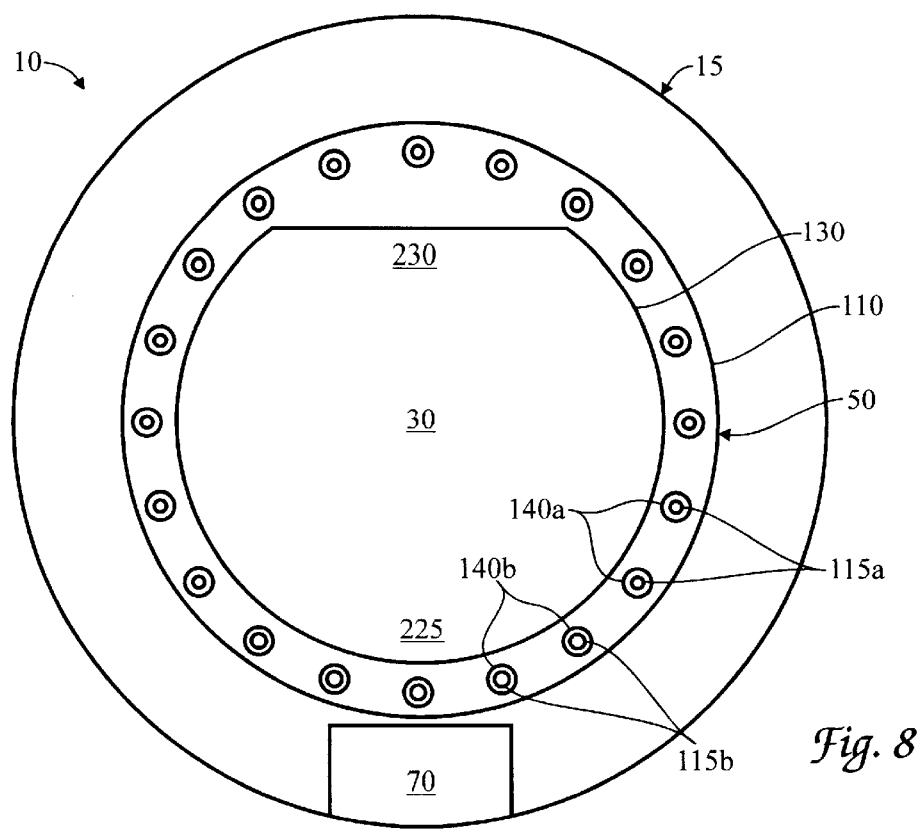
Fig. 8
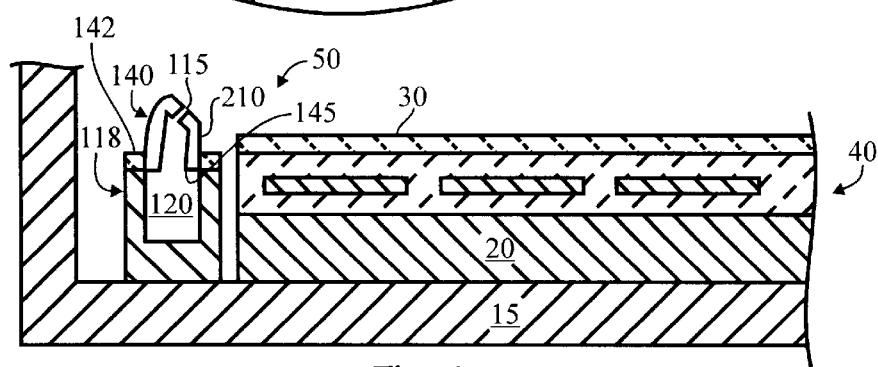
Fig. 9a
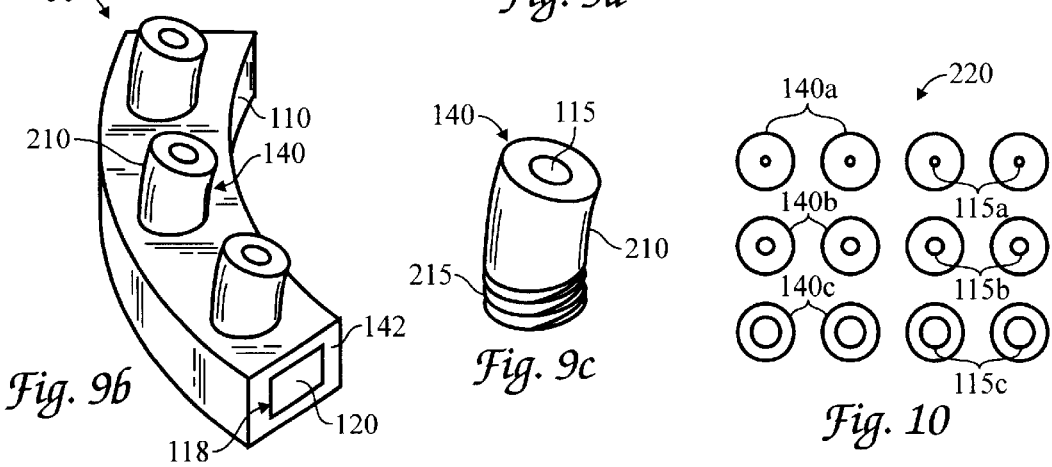
Fig. 9b
Fig. 9c
Fig. 10

PROCESS CHAMBER HAVING IMPROVED GAS DISTRIBUTOR AND METHOD OF MANUFACTURE

BACKGROUND

This invention relates to a process chamber for processing a substrate in a process gas.

In semiconductor fabrication processes, process gas is introduced into a process chamber through a gas distributor, optionally, a plasma is formed from the gas to etch features on the substrate or deposit layers of material on the substrate, and gaseous byproducts are exhausted from the process chamber via an exhaust system. In etching processes, the uniformity of the shape and size of features across the substrate is affected by the distribution of gaseous species across the substrate, especially when the size and spacings of the etched features become smaller. Similarly, in deposition processes, the thickness and composition of the deposited layer can vary across the surface of the substrate depending upon the distribution of gaseous species across the surface of the substrate.

Conventional process chambers, gas distributors, and exhaust systems often fail to provide a uniform distribution of reactive gaseous species across the substrate resulting in variations in the shape of the etched features or the thickness of the deposited layer. Shower-head gas distributors that inject process gas directly above the substrate can provide an asymmetric distribution of process gas across the substrate because higher gas flow rates occur over central portions of the substrate and lower flow rates at peripheral portions. Conversely, gas distributors that inject process gas from around the peripheral edge of the substrate provide higher concentrations of gas at the peripheral edge of the substrate. The distribution of gas in the chamber is also affected by the position and symmetry of the exhaust conduit of the process chamber. Asymmetrically positioned exhaust conduits result in asymmetric flow rates of gas across the substrate. Furthermore, as substrates increase in diameter up to 300 mm and beyond, the corresponding increases in the volume of the process chamber makes it even more difficult to provide a uniform distribution of process gas across the entire surface of the substrate.

The distribution of gas across the substrate can be improved by supplying the gas through a plurality of nozzles that extend through the ceiling or walls of the process chamber. However, chambers having ceramic walls or ceilings are difficult to fabricate with nozzle feedthroughs extending therethrough. The ceramic walls of polycrystalline ceramic material, such as aluminum oxide or silicon, are brittle materials and it is difficult to machine holes for passing feedthroughs through these materials without breaking or otherwise damaging the ceramic. Also, other components, such as RF induction coils, which are located adjacent to the ceramic walls further reduce the available space for locating a gas nozzle through the ceramic walls. Thus, there is a need for a process chamber having a gas distributor that provides a uniform distribution of gas in the process chamber without requiring an excessive number of feedthroughs to be machined through chamber walls.

Another problem with conventional process chambers arises because the gas distributors have fixed locations within the chamber which cannot be easily changed or adapted for different processes. For example, in one chamber design, gas nozzles extend through sidewalls and terminate near the edge of the substrate. The gas nozzles cannot be easily moved from one location to another in the process chamber without drilling additional holes in the chamber walls and sealing off the old holes. In addition, the gas nozzles have outlets with fixed sized diameters. However, new fabrication processes often require different introduction points and different flow rates of gas into the chamber. For example, as the gas flow rates into the chamber increase for larger diameter substrates, the desired gas introduction points also change. Thus, it is desirable to have a process chamber with a gas distributor that is adaptable to change the point source or flow rate of gas introduced into the chamber.

A further problem arises when a portion of the gas distributor is made from metal and is located within the energized plasma sheath in the process chamber. The metal component causes localized energy perturbations that lead to variations in plasma energy across the face of the substrate. In addition, the plasma species often chemically erode the metal to form contaminant particles that deposit upon the substrate. For example, an aluminum gas distributor is rapidly eroded by a halogen containing plasma. Thus, it is desirable for the metal portion of the gas distributor to be protected from erosion and electrically isolated from the plasma provide a more uniform plasma distribution.

Therefore, there is a need for a process chamber having a gas distributor capable of providing a uniform distribution of gas in the process chamber, especially for process chambers having ceramic walls or ceilings. There is also a need for a gas distributor that can be adapted to vary the distribution pattern or point sources of gas being introduced into the process chamber, which is determined by the location of the gas sources in the process chamber and the gas flow rates. In addition, there is a need for a gas distributor that is resistant to erosion by the plasma environment and that can be easily electrically isolated from the plasma.

SUMMARY

A process chamber according to the present invention is capable of providing a uniform distribution of gas across a substrate, is resistant to erosion by plasma, and can be easily adapted for different processes. The process chamber comprises a support having a surface for receiving the substrate. A gas distributor in the chamber, comprises a gas manifold having at least one insert comprising an orifice for introducing gas from the gas manifold to the process chamber for processing of the substrate. Preferably, the insert comprises a dielectric material.

In another aspect, the present invention comprises a method of processing a substrate in a process zone by a plasma of a gas. The method comprises the steps of placing a substrate in a process zone, introducing gas into the process zone via orifices in a gas manifold about the substrate, sustaining a plasma of the gas, and electrically isolating the orifices in the gas manifold from the plasma of the gas.

In yet another aspect, the present invention comprises a process chamber for processing a substrate comprising a support having a surface for receiving a substrate. A gas distributor in the process chamber comprises a plurality of orifices for introducing gas into the process chamber. One or more of the orifices are oriented at an inclined angle relative to a plane of the substrate. One version in which the orifices are oriented to direct gas toward a ceiling of the process chamber is particularly useful when the ceiling is made from a ceramic material.

In yet another version, the present invention comprises an apparatus comprising a support having a receiving surface for receiving the substrate; and a gas distributor comprising a gas manifold having orifices for passing gas from the gas manifold into the process chamber, the orifices having a plurality of diameters. The diameters of the orifices are selected to provide different rates of gas flow into different portions of the chamber.

In another aspect, the present invention comprises a process chamber for processing a substrate, comprising a support having a surface for receiving the substrate, and a gas distributor comprising a gas manifold having a removable insert therein, the removable insert comprising an orifice for passing gas from the gas manifold in the process chamber. Preferably, the gas distributor comprises a plurality of removable inserts. The removable inserts can be easily replaced or changed.

In still another aspect, the present invention comprises a kit of removable inserts for placement in a gas manifold of a process chamber useful for processing a substrate. The removable inserts comprise orifices with a plurality of diameters for passing gas from the gas manifold into the process chamber.

DRAWINGS

These and other features, aspects, and advantages of the present invention will become better understood with regard to the following description, appended claims, and accompanying drawings which illustrate examples of embodiments of the invention, where:

FIG. 2b is a side view of the gas distributor of FIG. 2a;

FIG. 3b is a side view of the gas distributor of FIG. 3a;

FIG. 4b is a partial perspective view of the gas distributor of FIG. 4a;

FIG. 8 is a schematic sectional top view of a process chamber having a gas manifold with a plurality of inserts about a perimeter of the substrate;

FIG. 9a is a schematic side view of a partial section of a process chamber having a gas distributor with a plurality of removable inserts;

FIG. 9b is a perspective view of a portion of the gas distributor of the process chamber shown in FIG. 9a;

FIG. 9c is a perspective view of a removable insert of the gas distributor of FIG. 9b; and FIG. 10 is a schematic top view of a kit of inserts having orifices with different diameters.

DESCRIPTION

Figure 1:
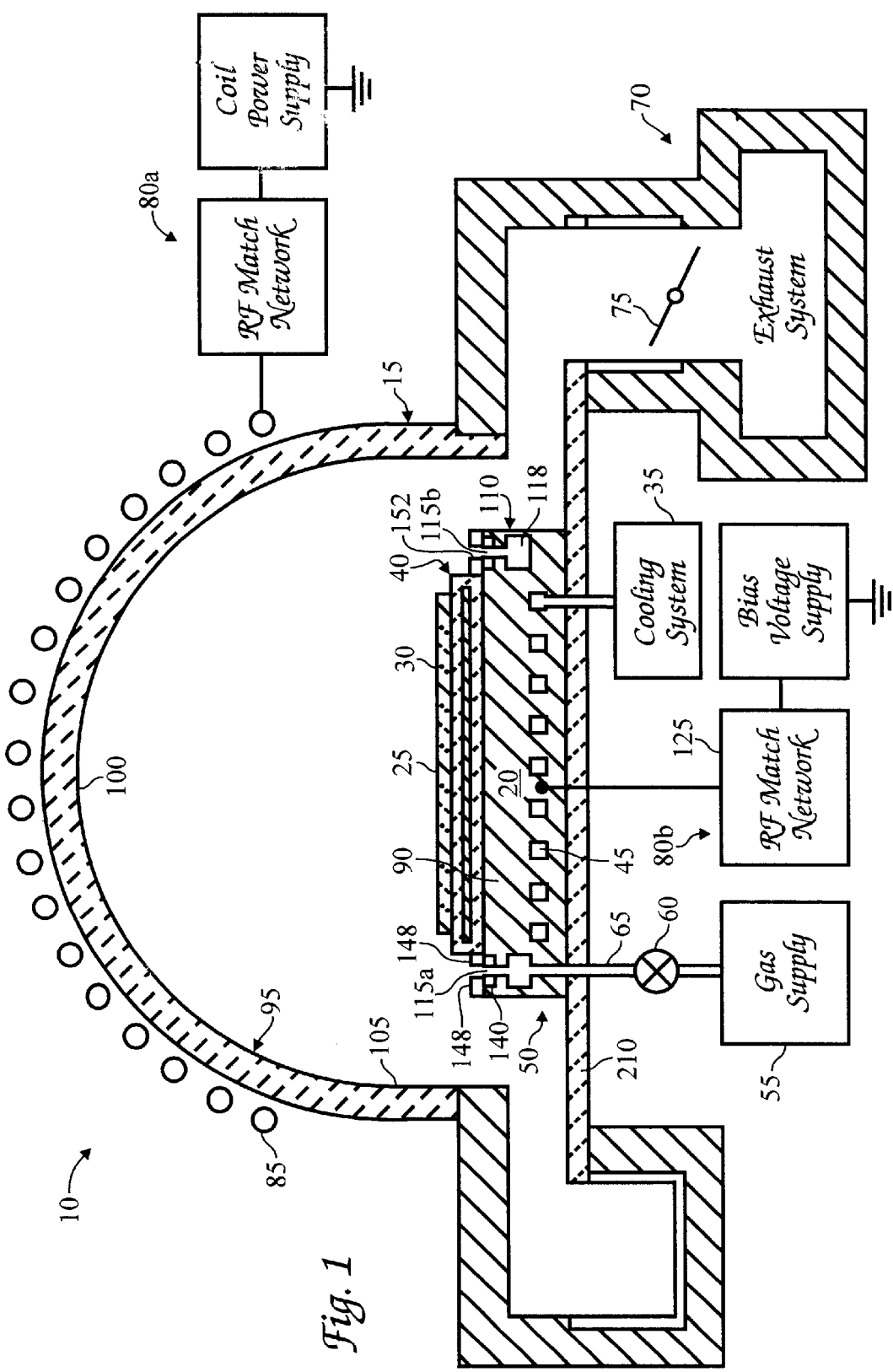
FIG. 1 is a schematic sectional view of a process chamber according to the present invention.

An exemplary apparatus 10 of the present invention is useful for processing of substrates 30, such as semiconductor and silicon wafers, as illustrated in FIG. 1. The apparatus 10 comprises a process chamber 15 that forms an enclosure for a support 20 having a surface 25 for receiving the substrate 30. Metals commonly used to fabricate the process chamber 25 are for example, anodized aluminum, stainless steel, or INCONEL™, of which anodized aluminum is preferred. Ceramic and semiconductor materials that can be used to fabricate the process chamber 25 include for example, silicon, silicon carbide, silicon dioxide, boron carbide, or aluminum oxide. It should be noted that although the present invention is illustrated by a chamber 15 for processing substrates 30 such as silicon wafers, the invention can also be for processing other substrates, such as flat panel displays, circuit boards, and liquid crystal displays, and in other process chambers as apparent to those of ordinary skill in the art and without deviating from the scope of the invention.

The substrate 30 is held in place on a chuck 40, such as an electrostatic chuck (as shown) or a mechanical chuck (not shown). The chuck 40 typically has holes (not shown) through which a heat transfer gas, such as helium, is passed through to promote heat transfer rates between the overlying substrate 30 and the chuck 40 to control the temperature of the substrate 30. The support 20 has a shape and size corresponding to that of the chuck 40 to provide a large area to maximize heat transfer rates between the support 20 and the chuck 40. Preferably, the support 20 also comprises passages 45 in which a fluid from a cooling system 35 is circulated to control the temperature of the support 20. More preferably, the support 20 is made of metal, such as aluminum with an anodized aluminum oxide coating that is resistant to erosion by the gas.

Gas is introduced into a process zone of the process chamber 15 through a gas distributor 50 via gas lines 65 from a gas supply 55, and the gas flow rates are controlled by gas flow control valves 60 in the gas lines 65. Spent gas and byproducts are exhausted from the chamber 15 through an exhaust 70 comprising roughing pumps, turbo-molecular pumps, or cryogenic pumps, which are typically capable of achieving a pressure of about $10^{-3}$ mTorr in the chamber 15. A throttle valve 75 is provided in the exhaust 70 for controlling the pressure of the gas in the chamber 15. The composition of the gas depends upon whether material is being deposited by chemical or physical vapor deposition, material is being etched from the substrate 30, or contaminant deposits are being cleaned from chamber walls and components. For example, typical gases for depositing $SiO_2$ on a substrate include silicon source gases, such as $SiH_4$ or $SiCl_2H_2$, and oxygen source gas, such as $O_2$; or gases containing both silicon and oxygen such as $Si(OC_2H_5)_4$. As another example, gases for depositing $Si_3N_4$ include $SiH_4$ and $NH_3$ or $N_2$. Typical etching gases include $BCl_3$, $Cl_2$, HCl, $SF_6$, $CF_4$, and $CHF_3$. Physical vapor deposition processes use non-reactive gases, such as argon, or mixtures of non-reactive and reactive gases.

Optionally, the gas is energized to process a substrate by gas energizers 80a,b that couple electromagnetic energy to the gas to form energized gaseous species, such as a plasma and activated gases. In the embodiment shown in FIG. 1, the gas is activated in the process chamber 15 by inductively coupling RF energy to the gas by applying an RF current to an inductor coil 85 encircling the process chamber 15. The gas can also be energized by capacitively coupling RF energy to the gas by applying an RF current to process electrodes 90, 95 in the process chamber 15. In this version, at least a portion of the support 20 comprises an electrically conductive metal electrode that is chargeable to serve as the process electrode 90. A partially facing conducting or semi-conducting portion of a ceiling 100 or wall 105 of the process chamber 15 serves as the other process electrode 95. The gas energizers 80a,b can also be operated to provide both inductive and capacitive coupling of energy to the gas. The frequency of the RF current applied to the inductor coil 85 or process electrodes 90,95 is typically from about 50 KHz to about 60 MHz, and more typically about 13.56 MHz.

A chamber 15 according to the present invention comprises a gas distributor 50 capable of providing a uniform distribution of process gas in the chamber 15 and that can be easily adapted for different processes or chamber configurations. The gas distributor 50 comprises a gas manifold 110 that extends around the substrate 30 with gas orifices 115 that are spaced apart across the gas manifold 110 to provide a distributed flow of gas around the substrate 15. The gas manifold 110 comprises a gas reservoir 118 that can hold an elevated pressure of gas to serve as a localized source of gas near the substrate 30. The gas manifold 110 reduces the pressure drop of the gas that would occur if a number of gas lines having smaller diameters (not shown) were to be used to supply gas to different portions of a chamber. In the version shown in FIG. 1, the gas manifold 110 comprises a reservoir 118 having one or more cavities about a perimeter of the substrate, for example, a cavity such as a channel 120 inside the support 20. The volume of the reservoir 118 depends upon the volumetric flow rate of gas desired to be introduced into the process chamber 15 and is sized sufficiently large to reduce variability of gas flow rates or gas pressures between different orifices 115a,b across the chamber 15.

In the version shown in FIGS. 2a and 2b, the gas manifold 110 comprises a channel 120 about a perimeter of the substrate 30, with the orifices 115 in the channel 120 being positioned in a plane below the surface of the substrate 30. Gas feed holes 132 extend through the support 20 to provide gas to the channel 120. The channel 120 is machined inside the support 20 and extends substantially continuously around an entire perimeter 130 of the substrate 30. The channel 120 has a rectangular cross-section with a lip 135 that is sized to support an annular ring 142 that covers and seals off the channel 120 from the chamber 15. The orifices 115 are formed by machining or drilling holes through the annular ring 142 in the top surface of the gas manifold 110. In addition, when the support 20 comprises a metal which can erode in the gas, the interior surfaces of the gas manifold 110 and orifices 115 are treated to prevent erosion by the gas. For example, for a support 20 comprising aluminum which reacts with fluorine-containing gases to form $Al_xF_y$ compounds, the surfaces of the gas manifold 110 and orifice 115 can be anodized with a thin layer of aluminum oxide that protects the support 20 from erosion.

Figure 2A:
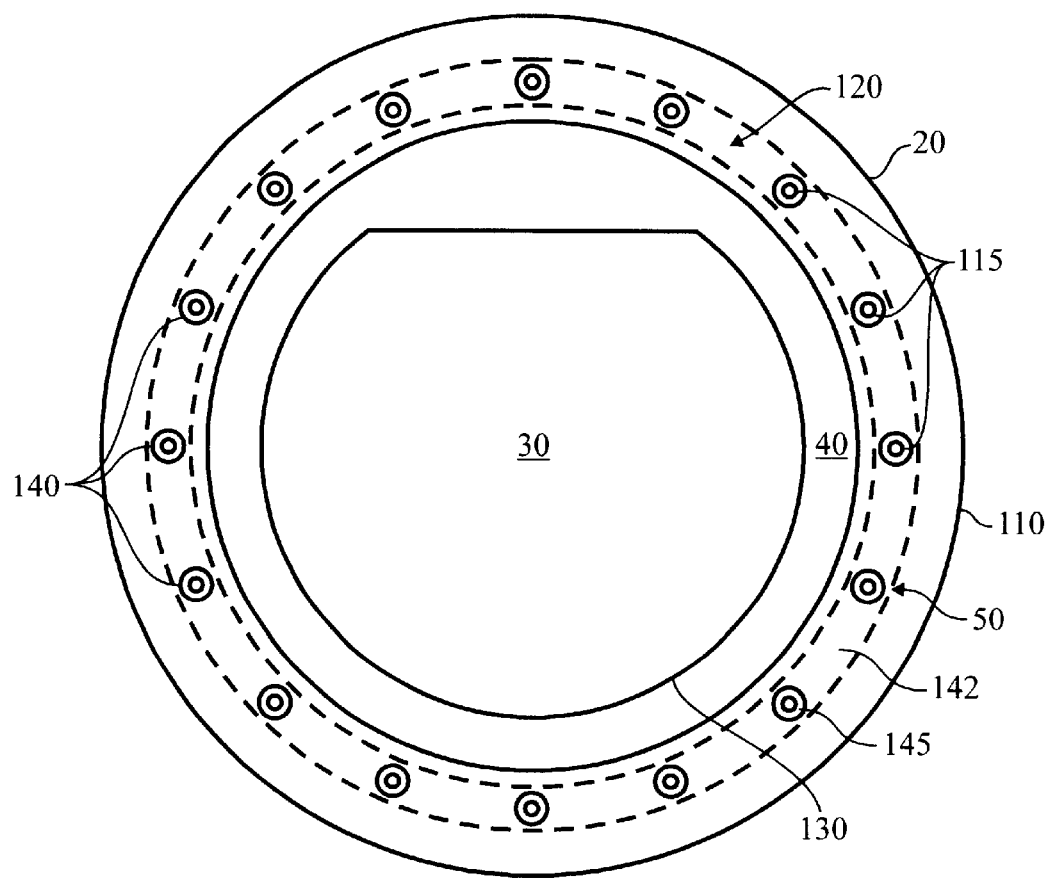
FIG. 2a is a schematic top view of a gas distributor according to the present invention showing a gas manifold having inserts disposed about a substrate.
Figure 2B:
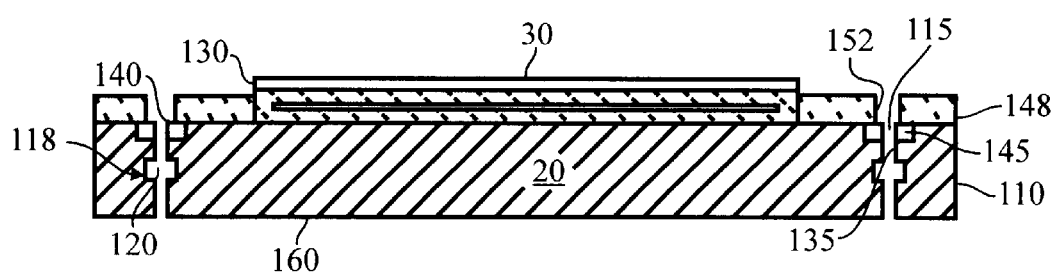

When the gas manifold 110 of the gas distributor 50 is made from an electrical conductor, such as a metal, a dielectric ring 148 is positioned over the top surface of the gas manifold 110, as shown in FIGS. 1 and 2b, to limit chemical or electrical interaction of the electrically charged plasma with the metal surface of gas manifold 110. The dielectric ring 148 comprises a dielectric material, such as a ceramic, for example, silicon dioxide or quartz. The dielectric ring comprises through holes 152 that have a diameter that is sized sufficiently larger than the orifices 115 in the gas manifold 110 to not impede the passage of gas from the orifices 115 into the chamber 15.

During operation, gas is supplied to the gas manifold 110 through the gas line 65 and flows out through the orifices 115 into the process chamber 15. The orifices 115 terminate at the surface of the support 20 around and adjacent to the substrate 30, and are positioned at a distance from the perimeter 130 of the substrate 30 that provides a uniform distribution of gas across the surface of the substrate 30. If the orifices 115 are positioned too far away from the perimeter 130 of the substrate 30 the gas species become chemically depleted before they reach the substrate 30. Also, dissociated gas species can recombine to form undissociated species by the time they reach the substrate 30. Conversely, if the orifices 115 are positioned too close to the substrate 30, excessively reactive or undissociated gas species reach the substrate 30 in a gas flow patterns that cause non-uniform processing of the substrate 30.

The diameter, number, and location of orifices 115 are also selected to provide the desired pattern of gas flow across the surface of the substrate 30. The number of orifices 115 depends on the size of the substrate 30, the distance of the orifices 115 from the substrate 30, and the peak volumetric flow rates of gas flowed through the orifices 115. For a chamber 15 for processing a 300 mm substrate 30 that has a volume of from about 8000 to 40,000 $cm^3$, a suitable number of orifices 115 is from about 4 to about 60. Such orifices 115 typically have diameters of at least about 100 micron and less than about 1200 micron. Preferably, the orifices 115 have very small dimensional variations, i.e., a set of orifices have diameters with dimensions that are accurate to less than 25 microns (about 1 mil).

Preferably, at least a portion of an orifice 115 extends through an insert 140 that is shaped to fit with a gas tight seal in a corresponding hole 145 in the gas manifold 110. The through holes 152 in the dielectric ring 148 overlying the inserts 140, as shown in FIG. 2b, have a diameter that is sized sufficiently smaller than the width of the inserts 140 so that the through holes 152 cover the inserts 140 with some clearance of either side to provide some tolerance in the position of the dielectric ring 148 on the gas manifold 110. The insert 140 is made from a ceramic, polymer, or metal material that can withstand the high temperatures and harsh chemical environment inside the chamber 15. Preferably, the insert 140 is made of dielectric material, such as a ceramic, that does not readily conduct RF energy. Forming the orifices 115 in a dielectric insert 140 reduces electrical discharges and arcing between the plasma and the gas manifold 110—which is typically made from metal and is often a part of the support 20, especially when the support 20 is electrically biased to serve as a process electrode 90 to sustain an energized plasma of gas. Without the insert 140 surrounding the orifice 115, the metal of the manifold 110 is sputtered away around the orifice 115, particularly where electrical energy is concentrated at the edges of the orifices 115. The higher electric flux at these regions increases the energy and frequency with which the ionized plasma species energetically bombard and sputter away material. Another problem arises when sputtered materials deposit on the substrate 30 to cause electrically short circuits. Also, sputtering of the edges of the orifices 115 can make them larger or more irregularly shaped which alters the flow of gas across the substrate 30. The inserts 140 electrically isolate the conductive metal of the manifold 110 or support 20 and comprise a thickness that is sufficiently high to reduce erosion by the plasma. A suitable thickness depends upon the size of the orifice 115. For example, a suitable thickness for an insert 140 having an orifice diameter of about 200 micron, is from about 1 mm to about 20 mm.

In one version, as shown in FIGS. 2a and 2b, the dielectric insert 140 30 comprises a disc supported by a ledge 135 near the top surface of the channel 120. The ledge 135 can extend longitudinally along the channel 120 to support a plurality of inserts 140 along the length of the channel 120. The thickness of the disc around the orifice 115 is from about 3 to about 5 times the diameter of the orifice 115 to protect from plasma erosion, and provide mechanical strength when the disc is made from a ceramic material.

The inserts 140 are made from a dielectric material that can withstand high temperatures and that is resistant to erosion and chemical degradation in the gaseous environment. The dielectric material is cast to near net shape, or machined from a larger sintered ceramic piece, and thereafter drilled to provide an orifice 115 having a precise and repeatable diameter. Preferably, the inserts 140 are also made from a ceramic material such as $Al_2O_3$, AlN, MgO, Si, SiC, SiO2, $Si_3N_4$, $TiO_2$, $ZrO_2$, and mixtures thereof, from which aluminum oxide, silicon, and silicon dioxide are generally preferred.

More preferably, the dielectric inserts 115 comprise monocrystalline ceramic that has a relatively small number of large crystals that are oriented with respect to one another. The term "monocrystalline" refers to a single crystal material or one that comprises a few (typically 10 or fewer) large ceramic crystals that are oriented in the same crystallographic direction. The large crystals within the monocrystalline ceramic typically have an average diameter of about 0.5 to about 10 cm. In contrast, conventional polycrystalline ceramics have small grains or crystals with diameters on the order of 0.1 to 50 micron, which is much smaller than the crystals of monocrystalline ceramic. The large crystals reduce impurity and grain boundary regions which are often rapidly eroded by erosive halogen environments. Thus, preferably, the dielectric inserts 140 are made from a homogeneous monocrystalline ceramic to reduce generation of particulate and contaminant foreign materials in erosive processes.

Suitable monocrystalline ceramic materials which exhibit erosion resistance in semiconductor processes include, for example, $Al_2O_3$, AlN, BN, Si, and mixtures and compounds thereof. In a preferred embodiment, the inserts 140 comprise monocrystalline sapphire, which is single crystal aluminum oxide that exhibits high chemical and erosion resistance in halogen plasma environments, especially fluorine containing environments. Monocrystalline sapphire also has a high melting temperature that allows use of the gas distributor 50 at high temperatures exceeding 1000° C. or even exceeding 2000° C. Also, the orifices 115 are drilled or ground into the monocrystalline material with a highly accurate and repeatable diameters.

Figure 3A:
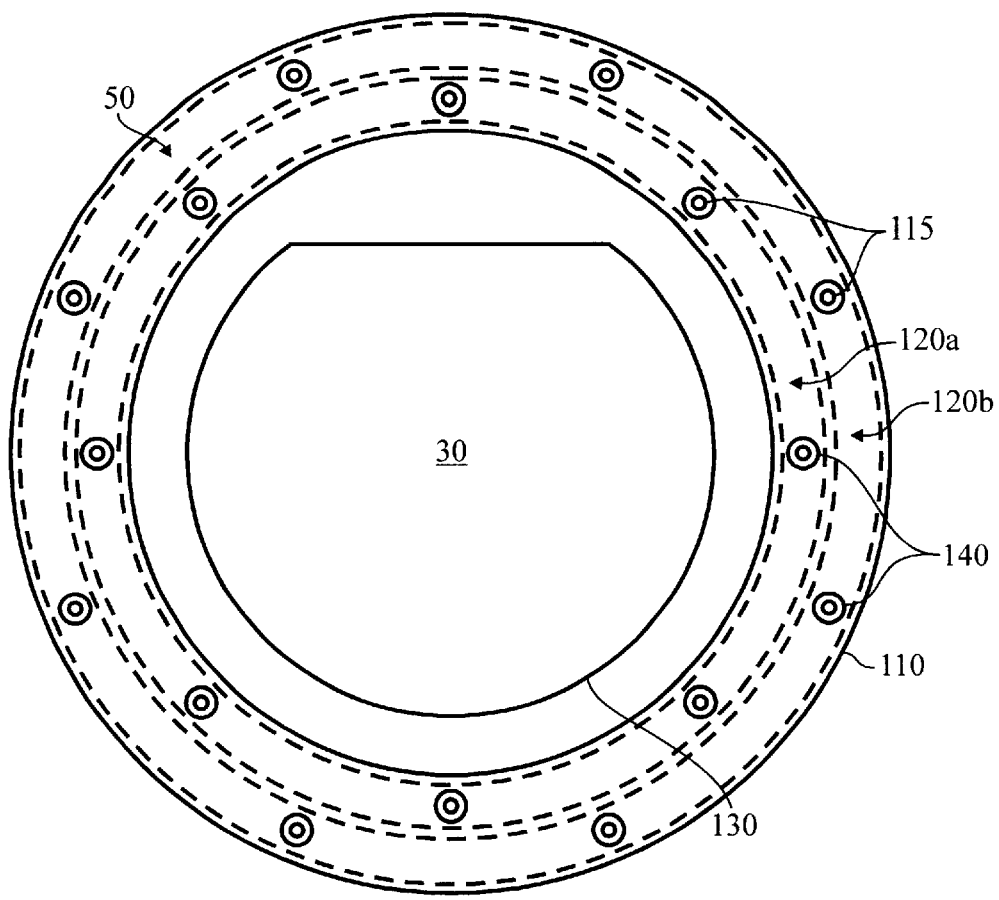
FIG. 3a is a schematic top view of another gas distributor according to the present invention.
Figure 3B:
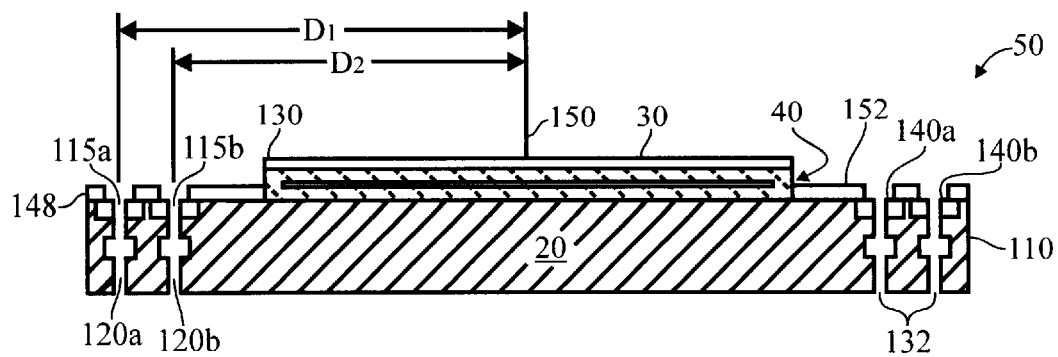

In another version, as illustrated in FIGS. 3a and 3b, the gas manifold 110 comprises a plurality of channels 120a,b that are separated from one another. Each channel 120a,b comprises a plurality of spaced apart dielectric inserts 140a,b each having an orifice 115a,b, respectively. Different gas compositions can be provided to each channel 120a or 120b to introduce different process gas compositions into the chamber 15 during processing of the substrate 30. For example, the gas supplied to the outer channel 120b can comprise a lower concentration of reactive gases to mask or shield surfaces or components in process chamber 15 from unwanted deposition or etching. As another example, the pressure or volumetric flow rate of gas supplied to each channel 120a or 120b can be different to control the flow rate and dispersion of the gas in the process chamber 15. Thus, the multiple channels 120a,b allow tailoring of the concentration and flow of the gas across the processing surface of the substrate 30. The channels 120a,b are radially concentric to one another with the first channel 120a being at a first distance $D_1$ from a central axis 150 of the support 20 and the second channel 120b being at a second distance $D_2$ from the central axis 150. The radially concentric channels provide a uniform dispersion of gas across the substrate 15, especially when the substrate 15 has radial symmetry, such as a circular semiconductor wafer.

Preferably, as shown in FIG. 3b, the orifices 115 are spaced apart along both channels 120a,b, such that circumferentially adjacent orifices 115 are positioned on either the first or the second channel 120a,b. The orifices 115 within each set are arranged in alternating positions about the circumference of the substrate 30, to allow the orifices 115 to be more closely spaced to provide a more uniform gas distribution around the substrate 30.

Figure 4A:
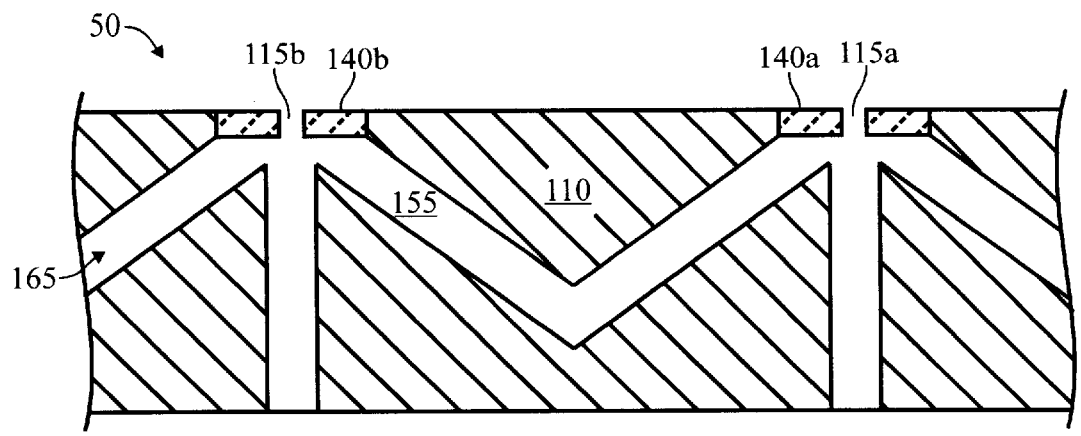
FIG. 4a is a partial schematic side view of another version of a gas distributor according to the present invention.
Figure 4B:
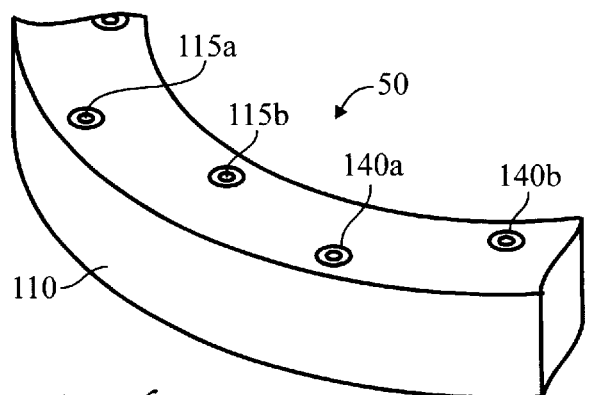

FIGS. 4a and 4b show another version of the gas distributor 50 comprising a gas manifold 110 having tubular segments 155 that are connected to one another to form a continuous gas flow path below the surface of the support 20. The short tubular segments 155 form a zig-zag shaped tubular passageway 165 around the periphery of the substrate 15. Each of the tubular segments 155 is oriented at an inclined angle relative to the surface of the support 20. In this version, the gas manifold 110 and the orifices 115 are formed by drilling discrete tubular segments 155 at an angle relative to the surface of the support 20. The orifices 115 are located at the intersection of tubular segments 155 on the surface of the support 20. The inclined angles are from about 15 to about 70° relative to the plane of the surface of the support 20 to facilitate machining of the tubular segments 155. When the orifices 115 are arranged in concentric ring patterns which are radially symmetric to one another, a single gas line 65 can feed gas to both sets of tubular segments 155, or a set of multiple gas lines that are radially spaced apart from one another can feed gas to each set of orifices 115.

Figure 5:
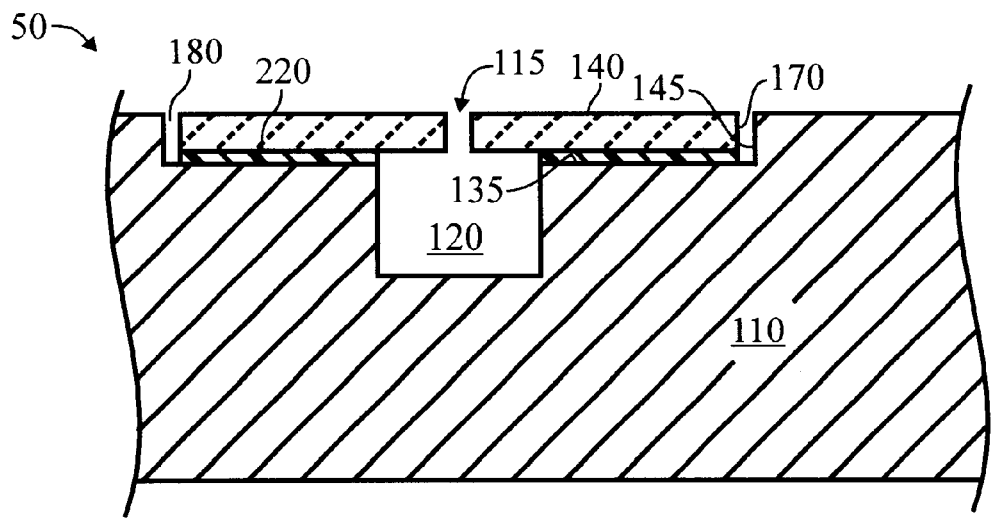
FIG. 5 is a partial schematic side view of a gas distributor having a manifold with a counterbore and an insert held therein by an adhesive pad.

Referring to FIG. 5, preferably, the inserts 140 are shaped and sized to compensate for a thermal expansion mismatch between the dielectric material of the insert 140 and the surrounding manifold material which is typically a metal having a high thermal expansion. For example, the outer diameter 170 of the inserts 140 is sized smaller than the diameter of the mating hole 145 to provide a thermal expansion gap 180 around the insert 140. The gap 180 is sized depending on the dimensions of the insert 140 and the thermal expansion coefficients of the insert 140 and gas manifold 110. For example, for inserts 140 made from a ceramic material and having an external diameter of from 1 to 10 mm, which is positioned in an aluminum gas manifold 110, a suitable size for a gap 180 is from about 1 to about 5 mm.

The insert 140 can be secured in the gas manifold 110 by an adhesive pad 220 that is positioned between the insert 140 and the lip 135 of the gas manifold 110. The adhesive 220 can completely fill the gap 180 to allow gas to flow only through the insert 140. Preferably, the adhesive comprises a resilient material that can be compressed to enable the insert 140 to thermally expand. A heat sensitive adhesive 220 which enables the inserts 140 to be easily removed from the support 20 for replacement by applying localized heat to the support 20 can also be used. Suitable adhesives 220 include heat setting or pressure setting adhesives, such as silicon and polyimide adhesives. The adhesive is resistant to thermal and chemical degradation, and preferably, comprises a liquid that is easy to apply during manufacturing. Another suitable adhesive is a liquid adhesive that is curable, such as an anaerobic adhesive that is cured in the absence of oxygen or ultra-violet radiation cured adhesive.

Figure 6:
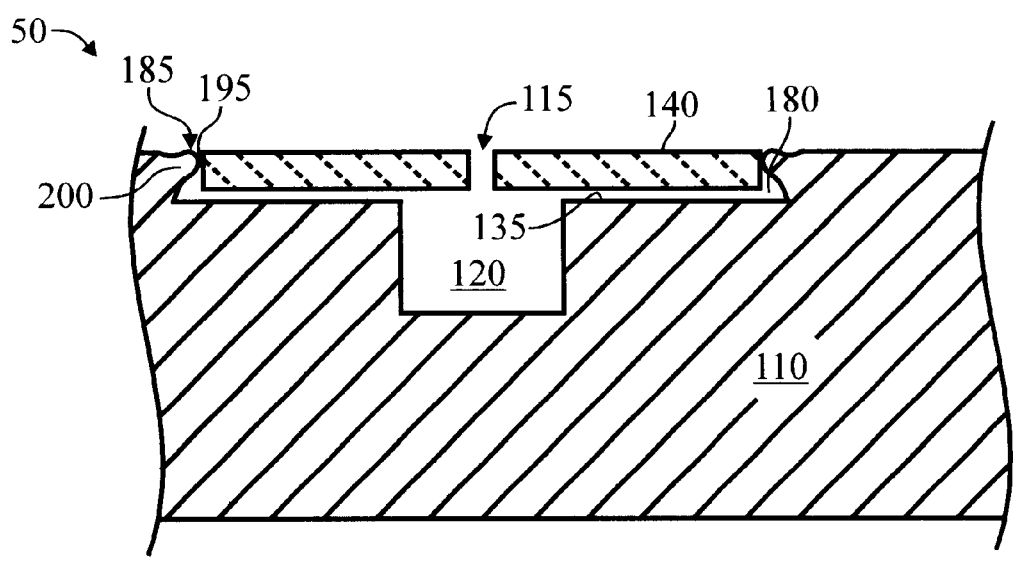
FIG. 6 is a partial schematic side view of a gas distributor having a manifold with an insert held by a circular stake around the periphery of the insert.

Referring to FIG. 6, the insert 140 can also be held in place by a securing stake 185 or ring that allows thermal expansion of the inserts 140 to reduce cracking and breakage of insert 140 when the support 20 is heated during processing. The holding stake 185 comprises sidewall 200 around the insert 140 which has an annular apex 195 that securely hold the insert 140 in place. The stake 185 extends around a periphery of the insert 140 to lock-in the insert 140 on the gas manifold 110. For example, the stake 185 can be formed by pressing out a portion of the malleable metal surface of the gas manifold 110 adjacent to the mating hole 145.

Figure 7A:
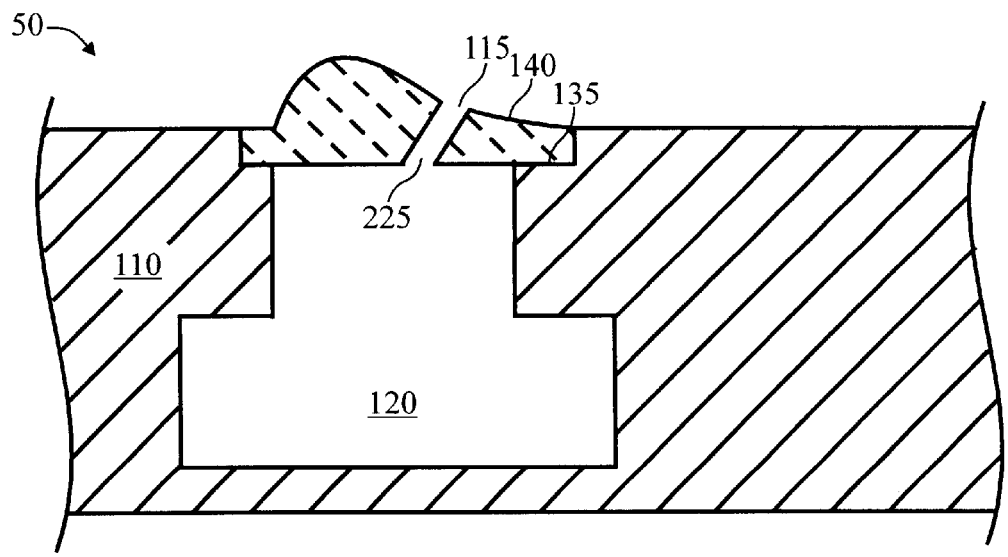
FIG. 7a is a schematic side view of a gas distributor having an insert with an orifice oriented at an inclined angle relative to a surface of the substrate.
Figure 7B:
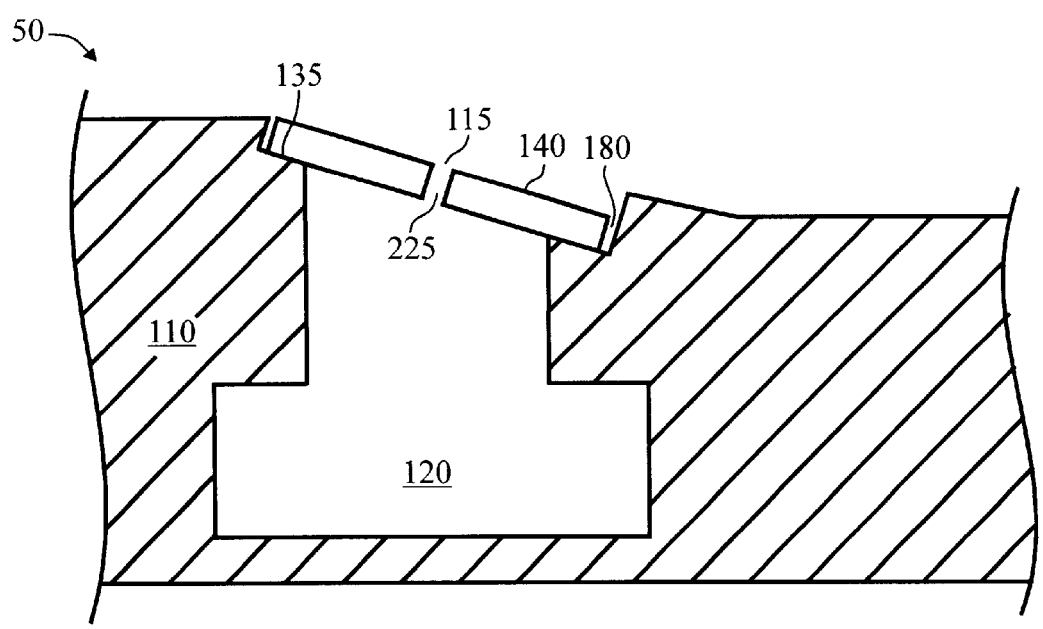
FIG. 7b is a schematic side view of another version of a gas distributor having an insert with an orifice oriented at an inclined angle relative to the plane of the substrate surface.

In yet another aspect of the present invention, as illustrated in FIGS. 7a and 7b, the gas manifold 110 comprises an orifice 115 that is oriented to direct a flow of gas at an inclined angle relative to the plane of the substrate 30. More preferably, the orifices 115 are oriented to direct gas toward the ceiling 100 of the process chamber 15. By directing gas toward the ceiling 100, a uniform distribution of gas is obtained in the process chamber 15 without requiring machining of gas feedthroughs through the ceiling 100, which is especially useful when the ceiling 100 is made from a ceramic material, such as for example, aluminum oxide, silicon dioxide, silicon carbide, or silicon. In one embodiment, as shown in FIG. 7, the orifice 115 comprises a pathway 225 that has a central axis oriented to inject the gas toward the ceiling 100 of the chamber 15 (not shown) and at an inclined angle relative to the surface of the substrate 30. The inclined orifices 115 can be in a dielectric insert 140 or can be drilled directly through the surface of the gas manifold 110.

The angle of inclination of the orifice 115 in an insert 140 is selected to be sufficiently high to spread out and provide a more uniform distribution of gas across the substrate 30. Preferably, the orifices 115 are inclined at a sufficiently high angle to direct gas toward the ceiling of the process chamber 15, a preferred angle of inclination being from about 10 to about 75°, and more preferably from 20 to 60°. At these angles, the gas streams from the orifices 115 provide a circulating gas flow pattern in the chamber 15 that provides a more uniform distribution of gas across the surface of the substrate 30, thereby improving process uniformity and yields.

The inclined orifices 115 can be formed in the inserts 140 by drilling the orifices 115 at an inclined angle relative to the plane of the insert 140, as shown in FIG. 7a. Alternatively, the surface of the supporting lip 135 in the gas manifold 110 can be machined at an inclined angle to support a flat insert having an orifice 115 drilled perpendicularly through the insert 140, as shown in FIG. 7b. Because machining the orifices 115 through brittle ceramic at an inclined angle is difficult, the latter embodiment in which the orifices 115 are perpendicular to the surface of an insert 140 that is mounted at an inclined angle on an inclined lip 135 surface is preferred. In either embodiment, the orifices 115 serve to provide a stream of gas into the process chamber at an inclined angle relative to the plane of the substrate 30.

FIG. 8 shows a top view of another version of the chuck 15 of the present invention comprising a gas distributor 50 with a gas manifold 110 having a plurality of orifices 115, with at least two orifices 115a,b having different diameters. A variety of different inserts 140a,b are positioned in the gas manifold 110 to achieve a desired gas flow pattern from the orifices 115a,b into the process chamber 15. Typically, the orifices 115a,b are arranged in the chamber 15 to provide a gas flow across the substrate 30 that provides uniform processing of the substrate 30. For example, large diameter orifices 115b are placed near the exhaust 70 where the localized gas flow rates are relatively low, and small diameter orifices 115a are placed at other portions of the chamber 15 where the localized gas flow rates are relatively high. The diameters of the orifices 115a,b can change continuously from one location in the chamber 15 to another, with discrete step changes in the diameters. The orifice diameters can also change across some other dimension of the chamber 15, such as a circumference, arc segment, or radius. For example, FIG. 8 shows a schematic of a process chamber 15 having a gas distributor 50 having a plurality of orifices 115a,b with different diameters arranged across a circumference of the chamber 15.

In yet another aspect, the gas manifold 110 comprises a removable insert 140 that is removable from the manifold 110 so that the insert 140 can be easily changed or replaced. For example, the removable insert 145 can also be glued with a heat sensitive adhesive layer into a hole 145 as shown in FIG. 5. In another version, as illustrated in FIG. 6, the removable insert 140 can comprise a dielectric ring that snaps into place in a corresponding hole defined by a circular stake 185 in a gas manifold 110. The removable insert 140 can also comprise a disc having a circumferential outer thread that mates with an inner thread in a hole 145 in the gas manifold 110 (not shown). The removable insert 140 comprises an external shape that is easily removable from a hole 145 in the gas manifold 110. The removable inserts 140 can be easily removed for cleaning, replacement, or for changing the size of the orifice 115 in the insert or the type of insert material. The removable inserts 140 are particularly useful for gas chemistries that leave behind a thin film or other residue film on the internal surfaces of the orifice 115 in the inserts 140.

In yet another version, as illustrated in FIGS. 9a–c, the insert 140 comprises a removable module 210 that is shaped and sized to be easily inserted into a corresponding mating hole 145 of the gas manifold 110 to form a gas-tight seal. The gas manifold 110 includes a flat ring 142 that forms a surface of a gas reservoir 118 in the gas manifold 110. Each insert 140 is in a removable module 210 shaped as a cylinder, and that has an outside thread 215 sized to engage, with a gas tight seal, a threaded hole 145 in the surface of the flat ring 142. The removable module 210 comprises a cylinder of a metal or ceramic material that is machined or shaped to form a gas tight seal in a hole 145 of the gas manifold 110. Alternatively, the insert 140 comprises a dielectric disc of ceramic material with the orifice 115 therethrough that fits into the module 210 comprising a metal cylinder. The surface of the metal cylinder is easier to machine to form a mating gas seal with the hole 142 in the gas manifold 110 so that it can be easily removed and replaced when chemically eroded from the passage of erosive gases through the orifice 115 in the insert 140. Preferably, a ceramic insert 140 made from aluminum oxide, is positioned in the metal cylinder, to protect the surrounding metal cylinder from chemical erosion arising from the passage of halogen gas through the orifice 115. Alternatively, the insert 140 comprises a unitary ceramic shaped as a cylinder and having the orifice 115 extending therethrough.

Another embodiment of the present invention comprises a series of dielectric inserts 140a–c that are in the form of a kit of replaceable inserts, as shown in FIG. 10, that removably fit into a gas manifold 110 of the apparatus 10. The removable inserts 140*a–c* comprise orifices 115*a–c* having different diameters. A user selects a desired diameter of gas orifice 115, and positions an insert 140 having the desired diameter in the appropriate position in a gas manifold 110 in the process chamber 15. This tailors gas flow rates across the substrate 70 by allowing placement of gas orifices 115*a–c* having openings with different sizes around the process chamber 15. For example, FIG. 8 shows the top view of a process chamber 15 in which different sized orifices 115*a,b* are arranged around the substrate 30 to provide an asymmetrical flow of gas into the chamber 14 to compensate for the asymmetrical removal of gas byproducts through the exhaust 70 which is closer to one portion 225 of the substrate 30 and farther from another portion 230. The asymmetrically located exhaust 70 causes an uneven gas distribution to occur in the process chamber 15 because it causes the gas introduced from the gas nozzles 115*a,b* to flow unevenly across the surface of the substrate 30. The asymmetrical flow of gas in the process chamber 15 is remedied by positioning orifices 115 having different diameters around the process chamber 15 to provide excess gas at portions of the substrate 30 having too high a flow rate of gas relative to the other portions 230 of the substrate 30, or vice versa. In the chamber shown, inserts 140*b* having large diameter orifices 115*b* are positioned next to the exhaust 70 and inserts 140*a* having orifices 115*a* with small diameters positioned next to other portions 230 of the substrate 30. The inserts 140 have orifices 115*a–c* with one of several different diameters that are selected depending upon the volume of the process chamber 15. For example, for a process chamber 15 having a volume of 40000 cc for processing a 200 to 300 mm substrate, a suitable set of diameters for the orifices 115*a–c* is from about 100 micron to about 1200 micron. For example, a suitable kit 220 of orifices 115*a–c* would have diameters of 100 micron, 200 micron, 500 micron, and 1000 micron. If the process chamber 15 used 4 or 6 gas orifices 115, each kit for the process chamber 15 would include a matching number of inserts, for example, 4 or 6 inserts 140 having orifices 115 with the preselected diameter.

The operator can conduct a series of experiments to select orifice diameters and their portions to optimize the gas flow uniformity and distribution of gas species in the process chamber 15. In these experiments, the operator uses a dummy substrate 30 having a blanket layer of material in a uniform thickness. This allows the operator to measure and compare relative etch or deposition rates across the surface of the substrate 30 that are achieved during the etching or deposition process. Generally, higher etch or deposition regions correspond to a higher flux of gas at that region of the substrate 30 and lower etch or deposition rates correspond to depletion of the gas. Accordingly, the operator would select and position inserts 140 having particular diameters across the process chamber 15 to compensate for this uneven distribution of gas across the substrate 30. Orifices 115*a* having smaller diameters are positioned adjacent to those regions of the substrate 30 exhibiting high etch or deposition rates, and orifices 115*b* having large diameters are positioned adjacent to those regions of the substrate 30 having low etch or deposition rates. In this manner, the flow of gas across the surface of the substrate 30 is regulated to provide a uniform distribution of reactive gaseous species.

While the present invention has been described in considerable detail with reference to certain preferred versions, many other versions should be apparent to those of ordinary skill in the art. For example, the gas manifold 110 and orifices 115 can be formed in any structure above, below, or around the substrate 30, such as a dielectric wall of the chamber 15. Thus, the chamber 15 and gas distributor 50 according to the present invention should not be limited to the illustrative embodiments of the invention described herein, and the spirit and scope of the appended claims should not be limited to the description of the preferred versions contained herein.

What is claimed is:

1. A process chamber capable of processing a substrate, the process chamber comprising:
   (a) a support having a surface capable of receiving the substrate; and
   (b) a gas distributor comprising a gas manifold having at least one insert comprising an orifice capable of introducing gas from the gas manifold to the process chamber to process the substrate.

2. A process chamber according to claim 1 wherein the gas manifold extends about the surface capable of receiving the substrate.

3. A process chamber according to claim 1 wherein the gas manifold comprises a cavity disposed about the surface capable of receiving the substrate.

4. A process chamber according to claim 1 wherein the gas manifold is in the support.

5. A process chamber according to claim 4 wherein the insert comprises a thickness that is sufficiently high to reduce erosion of the gas manifold from a plasma of the gas.

6. A process chamber according to claim 5 wherein the insert comprises a thickness of from about 1 mm to about 20 mm.

7. A process chamber according to claim 1 wherein the gas manifold comprises a plurality of inserts.

8. A process chamber according to claim 7 wherein at least two of the inserts have orifices with different diameters.

9. A process chamber according to claim 1 wherein the insert comprises a dielectric material.

10. A process chamber according to claim 9 wherein the dielectric material comprises a ceramic.

11. A process chamber according to claim 1 wherein the insert is secured in the gas manifold by a stake extending around a portion of a periphery of the insert.

12. A process chamber according to claim 1 wherein the orifice comprises a diameter of from about 100 to about 1200 microns.

13. A process chamber according to claim 1 wherein the orifice in the insert is oriented to direct gas into the process chamber at an inclined angle relative to a plane of the substrate.

14. A process chamber according to claim 13 wherein the orifice in the insert is oriented to direct gas toward a ceiling of the process chamber.

15. A process chamber according to claim 14 wherein the ceiling comprises aluminum oxide, silicon dioxide, silicon carbide, or silicon.

16. A process chamber according to claim 1 wherein the insert is removable from the gas manifold.

17. A process chamber capable of processing a substrate, the process chamber comprising a support having a surface capable of receiving the substrate, the support comprising a gas manifold about the surface capable of receiving the substrate, and the gas manifold comprising an insert having an orifice capable of introducing gas from the gas manifold into the process chamber to process the substrate.

18. A process chamber according to claim 17 wherein the gas manifold extends about the surface capable of receiving the substrate.

19. A process chamber according to claim 17 wherein the gas manifold comprises a cavity in the support.

20. A process chamber according to claim 17 wherein the insert comprises a thickness that is sufficiently high to reduce erosion of the gas manifold from a plasma of the gas.

21. A process chamber according to claim 17 comprising a plurality of inserts having orifices with different diameters.

22. A process chamber according to claim 17 wherein the insert comprises a dielectric material.

23. A process chamber according to claim 17 wherein the orifice in the insert is oriented to direct gas toward a ceiling of the process chamber.

24. A process chamber according to claim 17 wherein the orifice in the insert is oriented to direct gas into the process chamber at an inclined angle relative to a plane of the substrate.

25. A process chamber according to claim 17 wherein the insert is removable from the gas manifold.

26. A process chamber capable of processing a substrate, the process chamber comprising:
(a) a support having a surface capable of receiving the substrate; and
(b) a gas distributor comprising an insert and a plurality of orifices, one or more of the orifices being oriented to direct gas into the process chamber.

27. A process chamber according to claim 26 wherein the orifices are oriented to direct gas into the process chamber at an angle of from about 10 to about 75° relative to a plane of the surface capable of receiving the substrate.

28. A process chamber according to claim 26 wherein the orifices are oriented to direct gas toward a ceiling of the process chamber.

29. A process chamber according to claim 28 wherein the ceiling comprises one or more of aluminum oxide, silicon dioxide, silicon carbide, or silicon.

30. A process chamber according to claim 26 wherein the gas distributor comprises a gas manifold having the insert.

31. A process chamber according to claim 30 wherein the gas manifold extends about the surface cable of receiving the substrate.

32. A process chamber according to claim 26 wherein the orifices comprise diameters of from about 100 micron to about 1200 micron.

33. A process chamber capable of processing a substrate, the process chamber comprising:
(a) a support having a surface capable of receiving the substrate; and
(b) a gas distributor comprising a gas manifold having a removable insert therein, the removable insert comprising at least one orifice capable of passing gas from the gas manifold in the process chamber.

34. The process chamber of claim 33 wherein the gas distributor comprises a plurality of removable inserts.

35. The process chamber of claim 33 wherein the gas manifold comprises a hole and the removable insert fits in the hole with a gas-tight seal.

36. The process chamber of claim 35 wherein the removable insert comprises a thread that mates with a thread in the hole of the gas manifold.

37. The process chamber of claim 33 wherein the removable insert comprises a dielectric material.

38. A kit comprising removable inserts capable of being placed in a gas manifold of a process chamber useful in the processing of a substrate, each removable insert comprising an orifice capable of passing gas from the gas manifold into the process chamber.

39. A kit according to claim 38 wherein at least one orifice has a diameter of at least about 100 micron.

40. A kit according to claim 38 wherein at least one orifice has a diameter of less than 1200 micron.

41. A kit according to claim 38 wherein the removable inserts each comprise a surface that mates with a hole in the gas manifold to form a substantially gas-tight seal.

42. A process chamber capable of processing a substrate, the process chamber comprising:
(a) a support having a receiving surface capable of receiving the substrate; and
(b) a gas distributor comprising a gas manifold having orifices capable of passing a gas from the gas manifold into the process chamber, the orifices having an interior dielectric surface.

43. A process chamber according to claim 42 wherein the orifices are spaced apart in the gas manifold to provide a flow of gas across a substrate received on the support, whereby the substrate may be substantially uniformly processed.

44. A process chamber according to claim 42 wherein at least one orifice has a diameter of at least about 100 micron.

45. A process chamber according to claim 42 wherein at least one orifice has a diameter of less than about 1200 micron.

46. A process chamber according to claim 42 wherein the orifices are in removable inserts.

47. A substrate processing chamber comprising:
(a) a support having a surface capable of receiving a substrate; and
(b) an orifice in the processing chamber, the orifice comprising a holder capable of holding an insert in the orifice.

48. A processing chamber according to claim 47 wherein the orifice is in a gas distributor capable of providing a gas to process a substrate in the processing chamber.

49. A processing chamber according to claim 47 wherein the holder allows thermal expansion of the insert.

50. A processing chamber according to claim 47 wherein the holder comprises a securing stake.

51. A processing chamber according to claim 47 wherein the holder comprises a sidewall having an annular apex that is adapted to hold the insert.

52. A processing chamber according to claim 47 wherein the holder comprises a malleable metal surface.

53. A processing chamber according to claim 47 wherein the orifice is in a gas manifold.

54. A processing chamber according to claim 53 wherein the gas manifold comprises radially concentric channels.

55. A processing chamber according to claim 54 wherein at least one channel is radially offset from another channel.

* * * * *